United States Patent
Mantelet et al.

(10) Patent No.: US 7,290,927 B2
(45) Date of Patent: *Nov. 6, 2007

(54) METHOD AND DEVICE FOR CONVOLUTIVE ENCODING AND TRANSMISSION BY PACKETS OF A DIGITAL DATA SERIES FLOW, AND CORRESPONDING DECODING METHOD AND DEVICE

(75) Inventors: Guy Mantelet, Suce sur Erdre (FR); Anne Burban, Nantes (FR)

(73) Assignee: MHS, Nantes (FR)

( * ) Notice: Subject to any disclaimer, the term of this patent is extended or adjusted under 35 U.S.C. 154(b) by 763 days.

This patent is subject to a terminal disclaimer.

(21) Appl. No.: 10/627,760

(22) Filed: Jul. 28, 2003

(65) Prior Publication Data

US 2004/0017856 A1    Jan. 29, 2004

Related U.S. Application Data

(62) Division of application No. 09/362,109, filed on Jul. 28, 1999, now Pat. No. 6,683,914.

(30) Foreign Application Priority Data

Jul. 28, 1998  (FR)  ................................... 98 09636

(51) Int. Cl.
*H04L 27/06* (2006.01)
*H03M 13/03* (2006.01)

(52) U.S. Cl. ........................ 374/341; 375/262; 714/795

(58) Field of Classification Search ................. 375/242, 375/253, 262, 265, 298, 340, 341; 714/794–795
See application file for complete search history.

(56) References Cited

U.S. PATENT DOCUMENTS

| | | | | |
|---|---|---|---|---|
| 4,554,656 A | * | 11/1985 | Budrikis et al. | 370/445 |
| 5,465,267 A | * | 11/1995 | Todoroki | 375/279 |
| 5,875,214 A | * | 2/1999 | Urbaniak et al. | 375/341 |
| 6,088,827 A | * | 7/2000 | Rao | 714/786 |
| 7,080,311 B2 | * | 7/2006 | Gallet et al. | 714/786 |

* cited by examiner

*Primary Examiner*—Young T. Tse
(74) *Attorney, Agent, or Firm*—Stites & Harbison PLLC; Ross F. Hunt, Jr.

(57) ABSTRACT

A method for convolutive encoding process and transmission by packets of a digital data series in which a set of successive n=K−1 bits are discriminated to form a current word of n bits. A stable starting binary value for the convolution encoding is defined and the current word is subjected to a convolutive encoding of depth K, at each bit value i(k) corresponding thus an encoded symbol S(k)={a(k);b(k)}. A packet of encoded symbols is formed by concatenating the encoded symbols and the stable constraint value is assigned to the convolutive encoding at the packet end. An encapsulation message the packet of encoded symbols is generated and the encapsulation message and packet of encoded symbols are transmitted in the same message for decoding and use. Decoding of the encoded symbols takes place in relation to the encapsulation message value and packet of encoded symbols length.

18 Claims, 6 Drawing Sheets

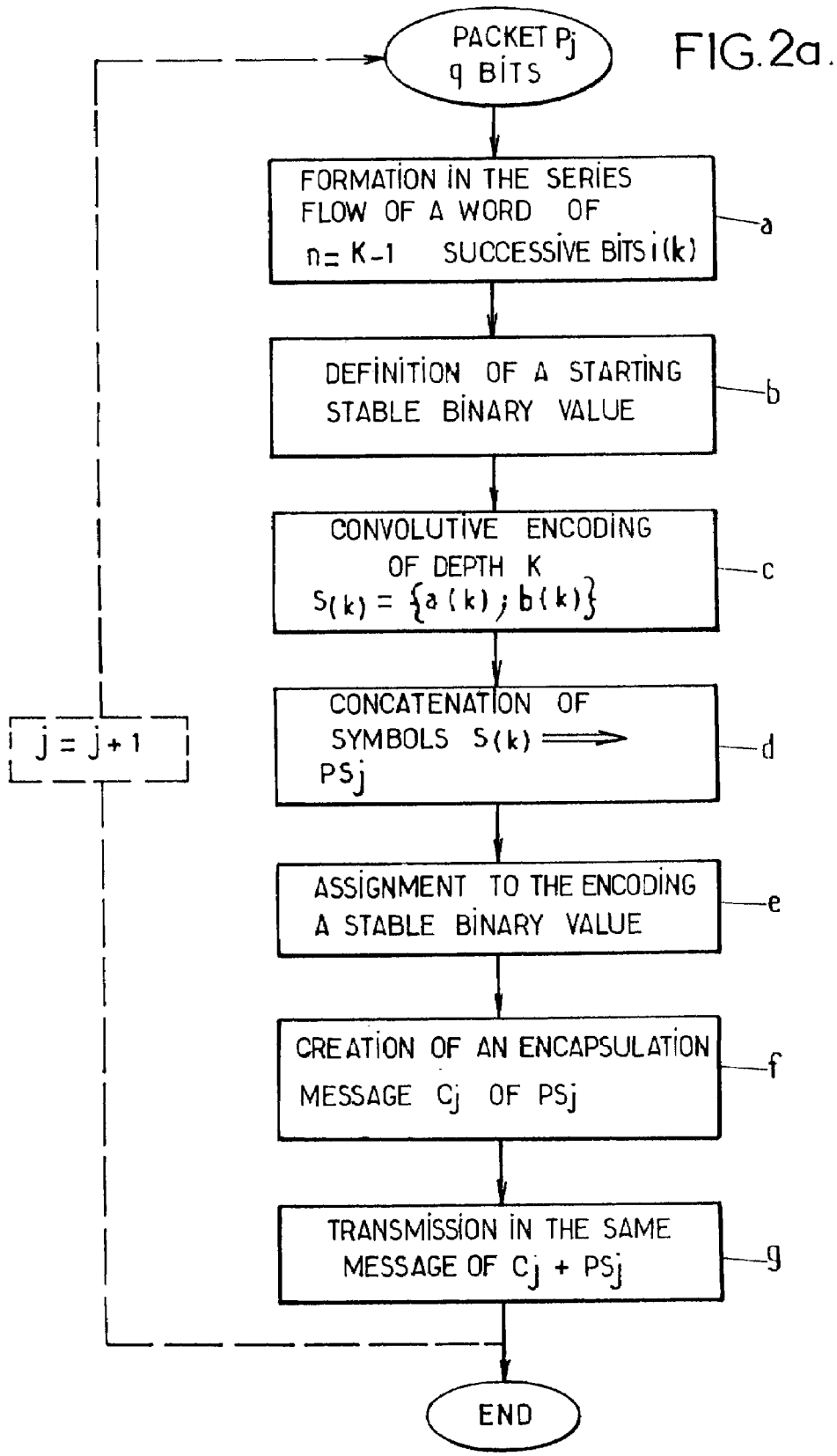

FIG.2b.
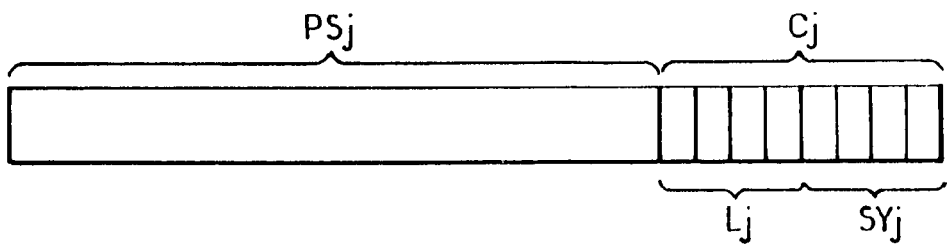
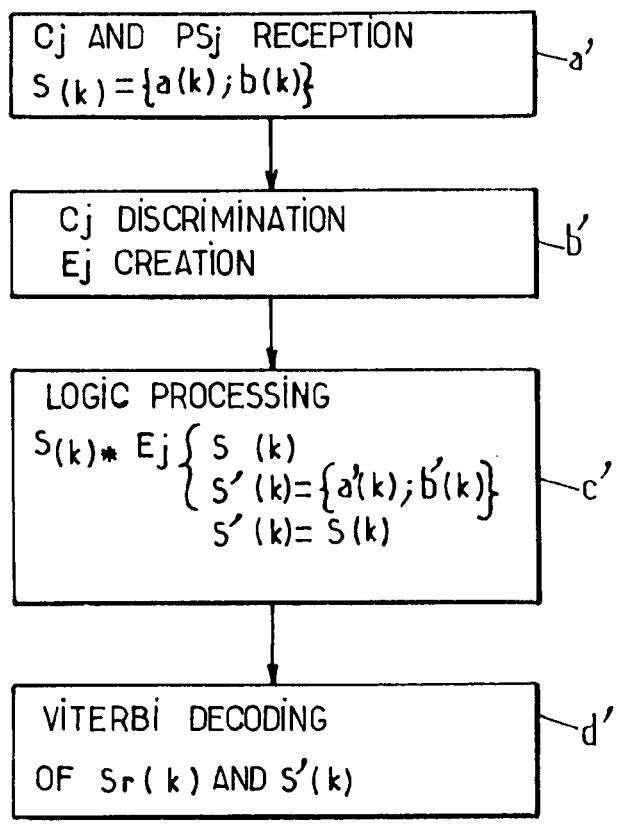
FIG.3a.

FIG.4e.
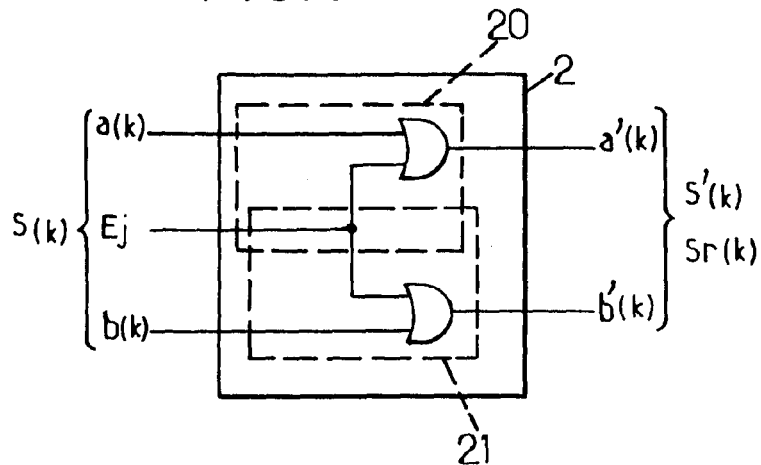
FIG.5.
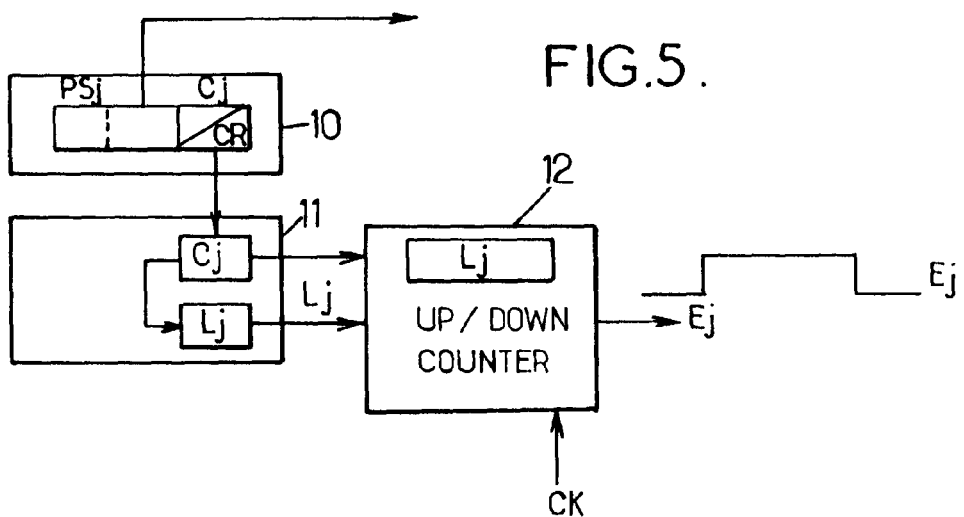
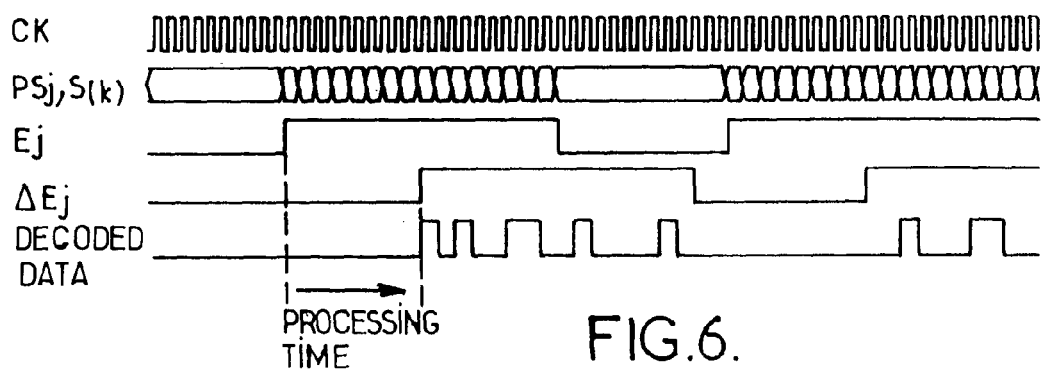
FIG.6.

METHOD AND DEVICE FOR CONVOLUTIVE ENCODING AND TRANSMISSION BY PACKETS OF A DIGITAL DATA SERIES FLOW, AND CORRESPONDING DECODING METHOD AND DEVICE

This application is a divisional of U.S. application Ser. No. 09/362,109, filed on Jul. 28, 1999, now U.S. Pat. No. 6,683,914.

FIELD OF THE INVENTION

The invention concerns a method for convolutive encoding and transmission by packets of a digital data series, the method and the corresponding decoding device.

BACKGROUND OF THE INVENTION

The technical area relating to the transmission of digital data, particularly by a radio or satellite channel has seen its importance take a growing significance, in the last decade.

A basic constraint is the conservation of the integrity of this data and finally of the intelligibility of the information carried during the transmission of this data. Indeed, in the case where physical disturbances, (in particular of a radio-electric nature), occur, the transmitted message is corrupted and may become unusable.

In order to protect against such risks, numerous applications using a digital data transmission method, audio and/or video transmission by terrestrial or satellite broadcasting, it is prudent to call for encoding processes of transmitted data, and in particular of convolutive encoding.

The convolutive encoding process represents a high performance error correcting encoding process class, which can be applied to operations of data series transmission, in a transmission channel disrupted by a Gaussian type of noise, such as the transmission channel by radio connection between a terrestrial station and a satellite station.

Generally speaking, to encode a message with a convolutional type of encoding, not only the current data present at the instant t at input to the encoder, current bit of rank k, is used, but also the n data values or bits of the previous rank. A memory effect of order n to encode this data is thus introduced. In referring to such a principle, it appears that every transmitted message takes account of the previous content of the message. The previous content of the message at the instant t is memorised in a memory updated with each current bit. The size of this memory is defined by the length of the previous content, which is called constraint length of the code used and designated by K, with K=n+1.

Referring to FIG. 1, relative to a known convolutive encoding device of the prior art, a memory formed for example by a shift register provided with elementary cells enabling n successive bits to be memorised, the bit previous to the current bit i(D−1) up to the bit i(D−n) of rank D−n, then enables a logic processing, by an exclusive OR type of logic operator for example, of the current bit i(D) by several previous bits of a specified rank. In the usual way and in order to reinforce protection against errors, it is appropriate to generate two or more encoded values a(D) and b(D), correlated by two distinct constraints. Each encoded value associated with a(D);b(D) thus constitutes a representative symbol S(D)={a(D);b(D)} of the current data i(D). In the example of FIG. 1 given as a non-restrictive example, the depth of encoding is K=7. The successive encoded values a(D) and b(D) are given by the relations:

$a(D) = i(D)g_1(D)$ with $g_1 = 171$ oct $b(D) = i(D)g_2(D)$ with $g_2 = 133$ oct The notation oct designating the octal notation.

Thus the aforementioned convolutive encoding and the corresponding error correcting codes can be used by means of simple structure circuits.

The decoding process of such codes, and consequently the transmission error correction, necessitate on the other hand the use of much more complex functions.

In particular, in the case of convolutive encoding, the optimum decoding of a code obtained in this way can be obtained by means of the use of a decoding process according to the VITERBI algorithm. The principle of the aforementioned algorithm is based on the fact that the encoder corresponds in fact to a state machine or robot of simple structure or having at least a limited number of states.

According to the aforementioned principle, the receiver-decoder searches for an estimation at each instant of the state of the encoder, to determine the transmitted sequence during the reception of all new data, i.e. of the current bit of successive rank.

A universal decoding process of such a code then consists of comparing the received sequence, at the current instant, with all the possible sequences which can be transmitted and to choose, from amongst these, that which presents a maximum probability.

In order to do this, the most probable a posterior coded sequence is then determined by determining the smallest distance value between the received sequence and the possible coded sequences, the notion of distance value being defined according to the notion of Hamming distance.

A lattice diagram enables the developments of the state of the encoder to be displayed as a function of time, for the value of the data of input bit of rank k, each lattice node representing a possible state of the encoder and of the encoded value. For each new value received, the Hamming distance is then calculated at each point of the lattice. This distance is accumulated with the calculated value at this same point during the evaluation of the previous value. To determine the most probable sequence then consists in returning to the lattice diagram and looking for the decoded values which correspond globally to the smallest accumulated Hamming distance.

For a more complete description of the VITERBI algorithm, reference is made to the article entitled *The Viterbi Algorithm* published by G. David FORNEY, Jr., Proceedings of the IEEE vol.61, No. 3, March 1973, pp. 268 to 278.

The search process of the decoded values which correspond globally to the smallest Hamming distance, by bringing into the diagram a data and sequence value with the following data and sequence value, necessarily involves a decoding and by corollary a highly continuous encoding process. In other words, if it is desired to process a decoding of a sequence generated by means of a convolutive encoding, it is in no way conceivable then to interrupt the recovery of the encoding or decoding. Such an interruption, introducing discontinuities in the lattice diagram, would then have the effect, because of such a discontinuity, of destroying any chance of finding the path for which the Hamming distance is minimal and consequently the most probable sequence.

OBJECTS OF THE INVENTION

The object of the present invention is to find a solution to the disadvantages of the prior art encoding/decoding processes by implementing a method convolutive encoding and transmission by packets of a digital data series flow and a method for decoding of a digital data series flow encoded by convolutive encoding and transmitted by packets according to this convolutive encoding method, in the absence of any degradation of corrective power inherent in the decoding process by means of a VITERBI algorithm, which is reserved for the decoding of continuous data flow encoded by convolutive encoding.

Another object of the present invention is to implement a method for a convolutive encoding and transmission by packets of a digital data series flow coming from separate encoders, this digital data being therefore a priori uncorrelated, and a corresponding method for decoding enabling the corrective power inherent in the convolutive encoding and decoding process according to a VITERBI algorithm to be conserved, although it is reserved to the decoding of continuous data flow encoded by a convolutive encoding.

Another object of the present invention is finally to implement a decoding device for a digital data series flow encoded by convolutive encoding and transmitted by packets, according to the method for decoding which is the object of the present invention.

SUMMARY OF THE INVENTION

The method for convolutive encoding and transmission by packets of a digital data series flow, a succession of q bits i(k) of specified value, by means of a convolutive encoding of depth K, which is the object of the present invention, is noteworthy in that it consists at least of discriminating in the series flow a set of n=K−1 successive bits, n<q, to form a current word of n bits, in defining for the convolutive encoding process a stable starting binary value, subjecting the current word of n bits to a convolutive encoding process of depth K, at each bit value i(k) corresponding to a first a(k) and a second b(k) encoded value, the set of these first and second encoded values constituting an encoded symbol S(k)={a(k),b(k)} representative of the considered bit i(k), forming from the q encoded symbols a packet of encoded symbols by concatenation of these encoded symbols, assigning the convolutive encoding process the aforementioned stable value as the constraint value at the end of the packet, generating at least one encapsulation message of the packet of encoded symbols and transmitting, in the same message, the aforesaid encapsulation message and the aforesaid packet of encoded symbols for decoding and use, then to repeat the previous operations for each current packet of the flow of bits.

The method, which is the object of the present invention, for decoding a digital data series flow transmitted by packets in accordance with the encoding process according to the invention thus consists of at least, during reception of the encapsulation message and of the packet of encoded symbols, in discriminating the encapsulation message in order to generate an envelope logic signal having a first binary value prior to the start and after the end of the packet of encoded symbols and a second binary value during the reception of the encoded symbols, submitting the envelope logic signal and the encoded symbols to a logic process enabling to generate pause symbols of specified value and successive rank for the first binary value of the envelope logic signal, and successive validated encoded symbols, S'(k)={a'(k);b'(k)} of successive rank k corresponding to the encoded symbols S(k) for the second binary value of the envelope logic signal, to submit the pause symbols and the validated encoded symbols of successive rank to a continuous VITERBI type decoding, the aforesaid pause symbols enabling the continuity of the decoding lattice to be obtained by imposing a stable state between two packets of successive encoded symbols.

The decoding device for a digital data series flow encoded by convolutive encoding and transmitted by packets, representative of this encoded digital data, which is the object of the present invention, each representative packet of the digital encoded data comprising a current packet of successive encoded symbols associated with at least one encapsulation message adapted to signalize the transmission of this current packet, is noteworthy in that it comprises at least one discrimination module of the aforesaid encapsulation message enabling an envelope logic signal of the current packet to be generated, having a first and a second logic value, a logic processing module of the envelope logic signal and of the encoded symbols representative of this data, the aforesaid logic processing module enabling a continuous flow of digital data constituted by the aforesaid packet of successive encoded symbols to be generated, a VITERBI decoding module receiving the continuous flow of digital data, the aforesaid decoding module being updated to the pause state from the envelope logic signal for each current packet.

BRIEF DESCRIPTION OF THE DRAWINGS

The method for encoding process, the method and the method for decoding, which are the object of the present invention, will be better understood by reading the description and observation of the drawings below, in which, other than FIG. 1 relative to the prior art:

FIG. 2a shows a general flow chart of the method for convolutive encoding and transmission by packets of a continuous data flow according to the object of the present invention;

FIG. 2b shows, in a non-limitative embodiment, the structure of packets of encoded symbols transmitted by the use of the method for encoding, as illustrated in FIG. 2a;

FIG. 3a shows a general flow chart of a method for decoding for encoded symbols and transmitted in accordance with the method of the present invention, illustrated in FIG. 2a;

FIG. 3b shows in an illustrative way a generation stage of an envelope logic signal enabling to implement the decoding method illustrated in FIG. 3a;

FIGS. 4b to 4e show different embodiments particular to a logic processing module of encoded symbols and of the envelope logic signal, as a function of the pause value assigned to the encoding and to the decoding respectively and the logic value of the envelope logic signal in the active state;

FIG. 5 shows a diagram given as an example of a generator module of the envelope logic signal; and FIG. 6 shows a timing chart of signals applied at the output of a VITERBI decoding device in order to enable the discrimination by synchronisation of data decoded from validated encoded symbols.

DESCRIPTION OF THE PREFERRED EMBODIMENTS

A more detailed description of the convolutive encoding process and of transmission by packets of digital data series flow, in accordance with the object of the present invention, will now be given in connection with FIGS. 2a and 2b.

In a general way, it is shown that each packet of digital data $P_j$ to be encoded and to be transmitted is made up of a succession of q bits, $i(k)$, k designating the successive rank of each of the constituent bits of the data packet.

In a general way, it is shown that the process, the object of the present invention, uses a convolutive encoding process of depth K, as mentioned previously in the description.

As shown in FIG. 2a, the method, the object of the present invention, consists then, in a stage a), to discriminate in the data series flow, i.e. for every corresponding packet $P_j$, a set of $n=K-1$ successive bits, n being of course less than q, to form a current word of n bits.

The encoding method, the object of the present invention, consists also, in stage b) to define, for the aforementioned encoding process, a so-called start stable binary value, enabling in fact to initialise the encoding process as will be described in a more detailed way below in the description.

Figure 1:
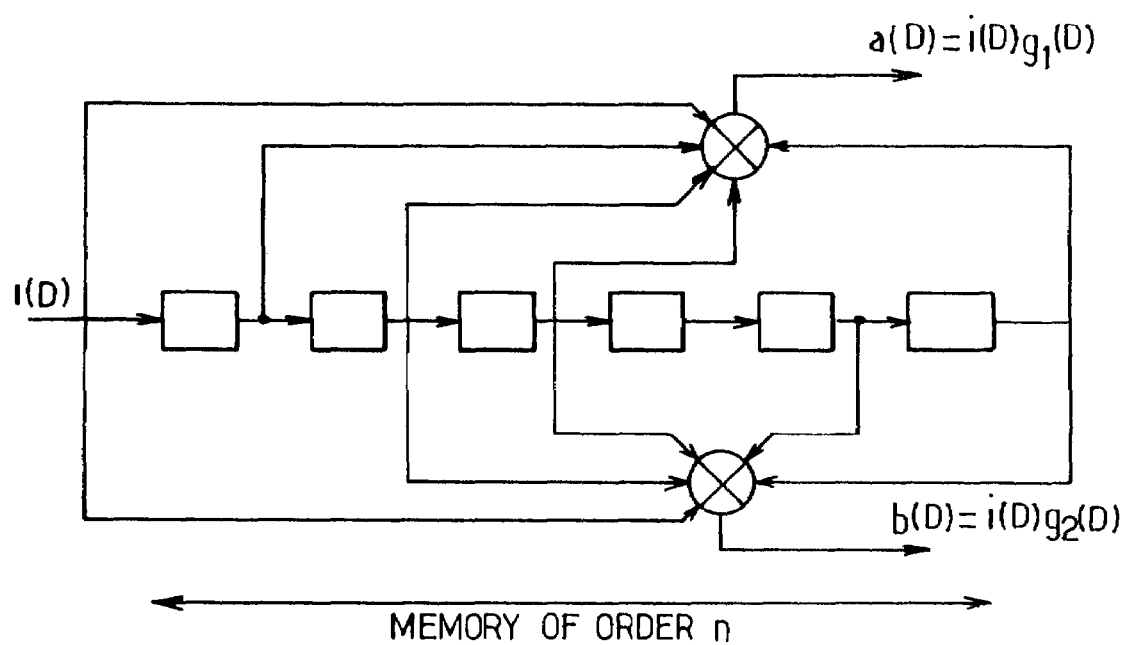

By reference to FIG. 1, it is shown that the stage a) can be performed by the use of a chain of memory cells comprising n memory cells intended to memorise the set of n successive bits in the data series flow and by shifting each bit of rank k of the word of n bits thus constituted. It is understood in particular that the aforementioned memory cells chain can to advantage be achieved by a shift register, which enables from the data series flow the sampling of a sliding window forming the aforementioned word of n bits.

With regard to stage b) consisting of defining, for the convolutive encoding process, a stable starting binary value, it is shown that this binary value is to advantage assigned to the set of constituent memory cells of the aforementioned chain of memory cells. Thus, the encoding process in accordance with the object of the present invention, consists in fact of previously initialising at the creation of the first word of n bits in the aforementioned packet $P_j$, the convolutive encoding process itself with the retained stable binary starting value. It is understood that in the absence of the packet $P_j$, the set of constituent memory cells of the memory cells chain is then positioned at the stable starting value, the value 0 or the value 1, as will be described later in the description.

The stages a) and b), as shown in FIG. 2a, are then followed by a stage c) consisting of subjecting the current word of n bits thus formed to a convolutive encoding process of depth K, so that to each value of bit $i(k)$ correspond a first $a(k)$ and a second $b(k)$ encoded value, these encoded values constituting an encoded symbol marked $S(k)=\{a(k);b(k)\}$, this symbol being representative of the considered bit $i(k)$.

The symbols $S(k)$ can be obtained in an advantageous way from an encoding process such as shown in FIG. 1 for example. It is shown in particular that the encoding process is thus used successively for the set of words of n bits constituting the considered packet $P_j$ according to the process indicated previously in the description.

With the stage c) is then associated a stage d) consisting of forming, from the encoded symbols, the number of encoded symbols being equal to the number of bits constituting the considered packet $P_j$, a packet of encoded symbols, marked $PS_j$, by concatenation of these encoded symbols. The concatenation process used consists in concatenating successively the successive values $a(k)$ and $b(k)$, constituent of each encoded symbol.

The aforementioned stage d) is itself followed by a stage e) consisting of assigning to the convolutive encoding process the stable value, the aforementioned so-called starting value. In these conditions, it is understood that the stable value re-applied to the encoding process enables in fact this value to be applied not only as the starting value for every later data packet $P_{j+1}$ likely to be subjected to the encoding process and the transmission by packets at any instant, but also as the constraint value to the encoding process in order to purge the memorised value in each memory module from the end of the encoding process of the current data packet $P_j$, according to the method which is the object of the present invention.

From the obtaining of the packet of encoded symbols $PS_j$ in the stage d), and indeed from the assignment to the encoding of the stable starting value in the stage e), the encoding method according to the invention consists then in generating at least one encapsulation message of the packet of encoded symbols. This encapsulation message, marked $C_j$, can consist, of a synchronisation word $SY_j$ and a length value $L_j$ of the considered packets of symbols $PS_j$.

The encapsulation message $C_j$ having been created, the method, the object of the present invention, consists then of transmitting, in the same message, the aforementioned encapsulation message $C_j$ and the encoded packet of symbols $PS_j$, as shown in the stage g) of FIG. 2a. This transmission in the same message can consist of carrying out a concatenation of the encapsulation message $C_j$ and of the packet of encoded symbols $PS_j$, then to carry out the transmission of the resulting message thus obtained for decoding and use. Of course, in the absence of later data packets $P_{j+1}$, the convolutive encoding process and the transmission by packets of a digital data series flow according to the object of the present invention, leads to an end stage, shown in FIG. 2a, whereas, in the presence of a later digital data packet of rank j+1, the previous operations a) to g) are repeated for the aforementioned packet, becoming the current packet, constituent of the flow of bits, and eventually for every successive packet.

In FIG. 2b, a message resulting from the concatenation of an encapsulation message $C_j$ and from the encoded symbols $PS_j$ has been shown. In a standard way, it is shown that the encapsulation message can consist of an encoded synchronisation word $SY_j$ in a field of 4 octets for example and a length field of the packet of encoded symbols $PS_j$, length field marked $L_j$, which can be encoded for example over 24 octets. Of course, in the resulting message such as shown in FIG. 2b, the length of the field corresponding to the packet of encoded symbols $PS_j$ corresponds to the length value of the encoded symbols contained in the field $L_j$.

The method for convolution encoding and transmission by packets of a digital data flow, in accordance with the object of the present invention, such as described in connection with FIGS. 2a and 2b, can be used for the encoding of packets transmitted in an asynchronous way along a transmission line, these packets being able in particular to emanate from separate and uncorrelated transmitters.

In these conditions, it is understood that the convolutive encoding process used in the method for convolutive encoding and transmission by packets, according to the object of the present invention, starts in fact for every data packet $P_j$ with a convolutive encoder positioned in the previously mentioned stable state. In these conditions the n memory elements are positioned for example, either with the value 0, or with the value 1. Similarly, in order to guarantee the whole of the processing of a packet, the convolutive encoding process used is then purged by the application to the encoding process of a specified fixed value. In the simplest embodiment, the specified fixed value enabling the encoding process to be purged consists in using the so-called starting stable value, this value being thus assigned to the encoding process beforehand and later to the encoding of a packet itself. In a non-limitative advantageous embodiment, it is pointed out that when the starting stable value is chosen equal to zero, the n memory cells being positioned with the value zero, in the same way and in accordance with a particular way of implementing the method which is the object of the present invention, it is then necessary to add at least n aforementioned so-called starting stable values, at the end of the packet, in order to purge the n memory cells of the considered chain of memory cells. It is the same when the chosen stable value has a value 1. In a simplified version, it is shown that the method, the object of the present invention, as a non-restrictive example, can then simply consist of adding by concatenation at the start and at the end of the data packet $P_j$, n considered stable values. However, in such a version, the value of encoded length in the field of length $L_j$ is, preferably, the value which corresponds to the actual length of the data packet $P_j$, taking account of the concatenated stable values at the packet start and end. An encoding device enabling the creation of a resulting message such as described in connection with FIG. 2b will not be described in detail because such a device uses standard elements enabling simply, from concatenation modules of the data packets $P_j$ of n stable values at the packet start and end, to supply in fact a convolutive encoder such as described in FIG. 1.

Figure 3B:
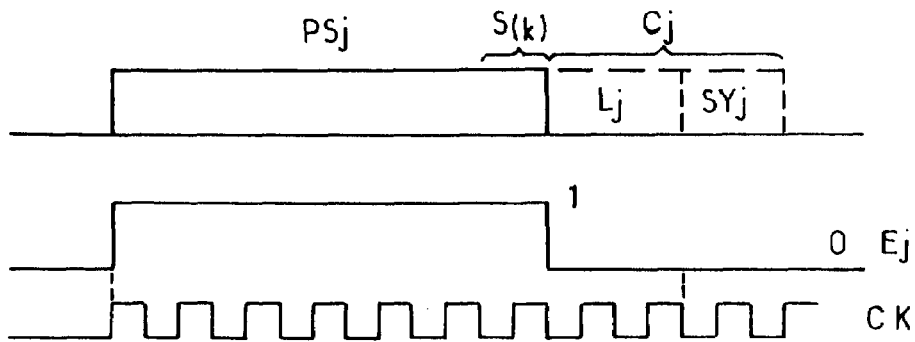

A method for decoding a digital data series flow encoded by convolutive encoding and transmitted by packets, according to the method which is the object of the present invention such as described in FIGS. 2a and 2b, will be now given in connection with FIG. 3a and FIG. 3b.

In a general way, it is recalled that in a non-restrictive preferential embodiment, the use of the encoding process, the object of the present invention, has the effect of generating the transmission of a resulting message such as shown in FIG. 2b. This resulting message includes the encapsulation message $C_j$, relating to the data packet $P_j$, and the message constituted by the encoded symbols $PS_j$ relating to the same aforementioned data packet.

In these conditions as shown in FIG. 3a, the decoding process, the object of the present invention, consists, in the reception of the encapsulation message $C_j$ and of the aforementioned encoded symbols $PS_j$, the reception stage being marked a' in FIG. 3a, to carry out at least one stage b') consisting of discriminating the encapsulation message $C_j$ in order to generate an envelope logic signal $E_j$ having a first binary value prior to the start and subsequently at the end of the packet of encoded symbols $PS_j$, and a second binary value during the reception of the aforementioned packet of encoded symbols $PS_j$.

The stage b') is itself followed by a stage c') consisting of subjecting the envelope logic signal $E_j$ and the encoded symbols $S(k)$ to a logic processing enabling the generation, on the one hand, pause symbols of specified value and successive rank for the first logic value of the envelope logic signal $E_j$ and, on the other hand, of the validated encoded symbols of successive rank k, these validated encoded symbols marked $S'(k)=\{a'(k);b'(k)\}$ for the second binary value of the envelope logic signal. Of course, the validated encoded symbols correspond to the encoded symbols $S(k)$ originating during the second binary value of the aforementioned envelope logic signal.

It is understood in particular that the logic processing, marked * in FIG. 3a, enables carrying out in fact the operation $$S(k)*E_j$$

this logic operation being defined as a function, on the one hand, of the effective logic value of the first logic value of the envelope signal, and, on the other hand, as a function of the pause value allocated to the convolutive encoding process itself, as will be explained later in the description.

Finally, the stage c') shown in FIG. 3a is followed by a stage d') consisting of subjecting the pause symbols and validated encoded symbols of successive rank to a continuous VITERBI type decoding, the pause symbols enabling the continuity of the decoding lattice to be ensured by holding a stable state from the stable starting value between two packets of successive encoded symbols.

It is understood of course that the logic processing applied to the encoded signals from the envelope logic signal enables in fact, the VITERBI decoding process itself, to generate specific values of pause symbols corresponding to the stable starting values, in order to enable a continuous VITERBI type of coding to be carried out.

The creation process of the envelope logic signal, from the encapsulation message $C_j$ such as described in connection with FIG. 3a to the stage b'), will be now described in connection with FIG. 3b.

By reference to the aforementioned figure, it is shown that on detection of the synchronisation word $SY_j$, for example by comparison of the field relating to the synchronisation word in the encapsulation message $C_j$ to a reference word, then on reading the length value $L_j$, the creation process of the envelope logic signal $E_j$ can simply consist of generating a logic signal with a first binary value, the value zero for example shown in FIG. 3b, from the recognition of the synchronisation word $SY_j$ for example, then to pass to the complemented value of this first logic value, the value 1 in FIG. 3b, at the end of a specified number of clock cycles corresponding to the effective transmission of the aforementioned field of length $L_j$. In FIG. 3b, the aforementioned clock signal is marked CK. The complemented value, the value 1 relating to the envelope logic signal corresponding to a second logic value of this latter, can then be held for the duration of the number of clock cycles corresponding to the reading of the successive encoded signals of the packet of symbols $PS_j$, then brought back to the first logic value, the value zero, from the end of the reading process previously mentioned in coincidence with the end of the reading of the aforementioned packet of symbols.

The VITERBI decoding process in the stage d') mentioned in connection with FIG. 3a is then the following.

The continuity in the lattice, the diagram specific to the VITERBI decoding, is obtained by holding and imposing the stable state from the aforementioned stable value between two consecutive packets of ranks j and j+1. This stable state is that which, definitely, represents the encoded data emitted at the start and at the end of the packet, the state which is held between two successive packets.

In a lattice, there only exist two states corresponding to these criteria, the state zero and the state 1 corresponding to the aforementioned stable values as a function of the depth K of the encoding process used. This state is equal to 3 for K=3 and to 63 for K=7.

Conceptually, the VITERBI algorithm guarantees indeed that, when the lattice is in state zero and that it always receives zeros, the state of this latter does not change, no divergence being introduced between the received value and the expected value. It is the same for a state 1 with the reception with a value 1.

Furthermore, if the encoding process uses as stable starting or pause value the zero value taken as constraint value, by construction, the VITERBI algorithm implies that the most probable path at the end of reception of a packet of encoded symbols $PS_j$ leaves the node or the zero state of this lattice and that the later packet will commence at the same node. The same principle is of course applicable for a constraint or pause value equal to 1, the packet starting and end state corresponding then to n values 1.

Figure 3C:
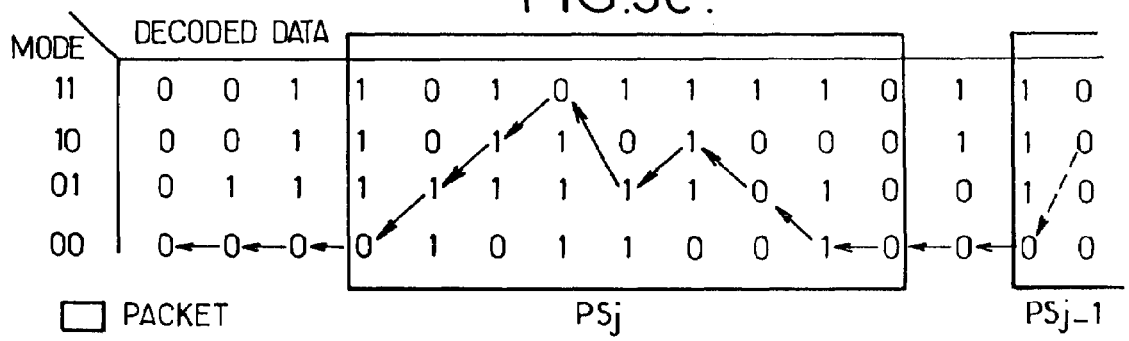
FIG. 3c shows a lattice diagram relative to a VITERBI decoding process applied to digital data encoded by convolutive encoding and transmitted in packet mode, in accordance with the method which is the object of the invention.

A representation of a lattice in a VITERBI decoding process for K=3 with a constraint value or stable value equal to zero is shown in FIG. 3c, for the successive packets $PS_{j-1}$, $PS_j$.

The method for convolutive encoding and transmission by packets of a digital data series flow and the corresponding decoding method, the objects of the present invention, enable, at the level of the decoding process, to force the lattice to stay at the stable state or the pause state established from the stable starting values between two successive packets, and therefore never to interrupt the processing of the data, even in the packets transmission mode.

As the transmission packets mode consists of transmitting data in bursts and to space these bursts in time, this mode therefore induces breaks in the logic continuity of the data transmitted and is not able therefore a priori to be subjected to a VITERBI type of decoding, the flow of data in the methods, the object of the present invention, is never interrupted. Indeed, the pause state appears as the natural state as the result of the method and it is not therefore necessary to modify the core of the design of the VITERBI decoder used in order to operate in packets mode.

It is understood, just as by the creation of the envelope logic signal from the encapsulation message, the logic processing between the encoded symbols and the envelope logic signal enables such a continuity to be simply ensured.

It is understood of course that the process or operating mode of the encoder rigorously follows the process or operating mode of the logic processing at the decoding level.

Different modes of carrying out the logic processing will now be given in connection with the form of the encapsulation signal and the pause value retained.

According to a first embodiment of the aforementioned logic processing, for a pause state just as for a first logic value of the envelope logic signal corresponding to the signaling of the packet start and end equal to the value zero, and for a second logic value of the envelope logic signal equal to the value 1, the logic processing is a logic processing by an AND logic function.

In such a case, if the envelope logic signal is inactive, i.e. the first logic value zero, the entering data is replaced by a zero value, which of course holds the lattice at the zero state, i.e. the pause state.

In a second embodiment, for a pause state equal to the value 1, a first logic value preceding the start and subsequent to the end of the packet of encoded symbols of the envelope logic signal equal to the value 1, and for a second logic value, the envelope activity, equal to the value 0, the logic processing carried out between the envelope logic signal and the encoded symbols S(k) is a type OR logic function with the complemented envelope logic signal.

In a third embodiment, for a pause state and a first logic value of the envelope logic signal equal to the 0 value and for a signal representing the envelope activity, to the second logic value, equal to the value 1, the logic processing carried out between the envelope logic signal and the encoded symbols is an AND logic function with he complemented envelope logic signal.

In a fourth embodiment, for a pause state and a first logic value of the envelope logic signal equal to the value 1 and for an activity signal of the envelope corresponding to the second logic envelope value equal to the value zero, the logic processing between the symbols S(k) and the envelope logic signal is an OR type function with the aforementioned envelope logic signal.

Other embodiments can be imagined.

A more detailed description of a decoding device for a digital data series flow encoded by convolutive encoding and transmitted by packets, according to the encoding process previously described in the description, will now be given in connection with FIGS. 4a to 4d.

Figure 4A:
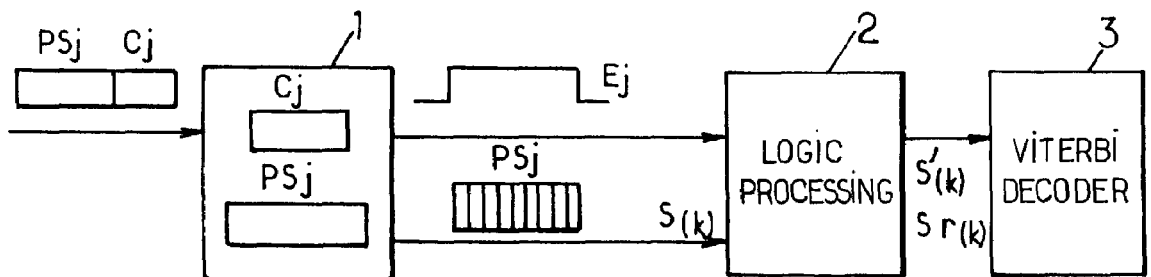
FIG. 4a shows, in the form of a synoptic diagram, a decoding device in accordance with the object of the present invention.

Taking account of the structure of the resulting transmitted message, such as shown in FIG. 2b, the device such as shown in FIG. 4a can comprise to advantage a discrimination module 1 for the encapsulation message $C_j$ enabling an envelope logic signal $E_j$ to be generated as previously mentioned in relation to the current packet of symbols $PS_j$. The envelope logic signal $E_j$ has a first and second logic value as previously mentioned.

The decoding device comprises furthermore a logic processing module 2 of the envelope logic signal and of the encoded symbols S(k) representative of the encoded data. The module 2 receives the envelope logic signal $E_j$ and the symbols S(k), the logic processing module 2, by the use of the aforementioned logic functions, enables a continuous flow of digital data constituted by the packet of successive encoded symbols to be generated to which can be associated the pause symbols, marked Sr(k) corresponding to the pause state.

Finally, the decoding device includes a VITERBI decoding module 3 receiving the continuous flow of aforementioned digital data, this decoding module being thus updated to the pause state from the envelope logic signal, by means of the introduction of the pause symbols S(k), this operation being of course carried out for each current packet PSj.

In a general way, it is shown that the logic processing module 2 includes a first logic cell 20 receiving, in a first input, each first element of symbols a(k) and, in a second input, the envelope logic signal $E_j$, this first logic cell 20 delivering a first element of validated symbols a'(k). Moreover, the logic processing module includes a second logic cell 21 receiving, in a first input, each second element of symbols b(k) and, in a second input, the envelope logic signal $E_j$, and delivering a second element of validated symbols b'(k).

The first 20 and second 21 logic cells will now be described in connection with the different logic functions used, previously mentioned in the description.

Figure 4B:
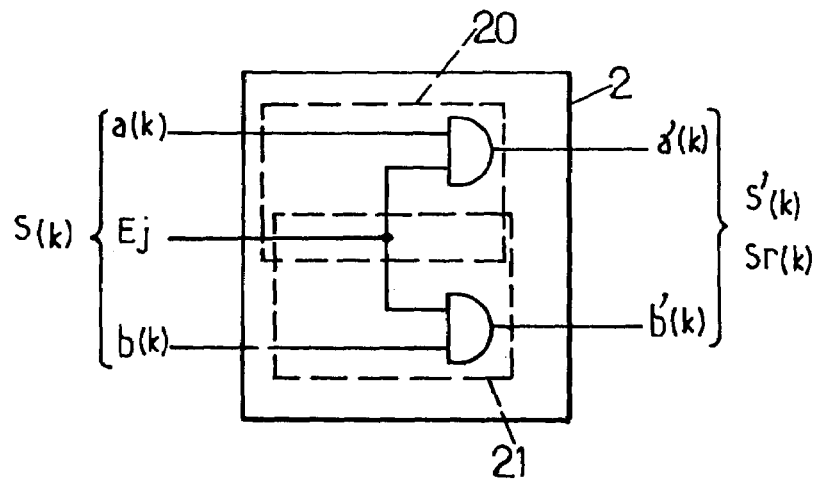

In FIG. 4b, when the logic function is a type AND logic function, each first 20 and second 21 logic cell includes an AND gate receiving the envelope logic signal $E_j$ in one of their inputs and the symbol element a(k), b(k) respectively in the other of their inputs, in order to deliver the validated encoded symbol S'(k) or the pause symbol Sr(k).

Figure 4C:
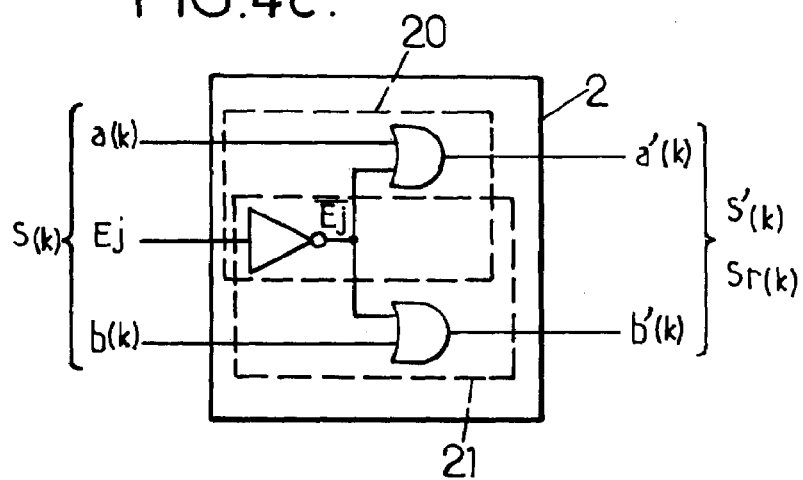

In FIG. 4c, when the logic processing corresponds to a type OR logic function with the complemented envelope signal, the first 20 and the second 21 logic cells are formed by an OR gate receiving in one of their inputs the envelope logic signal $E_j$ by means of an inverter, and in the other of their inputs, the symbol element a(k), b(k) in order to deliver the validated encoded symbol S'(k) and the pause symbol Sr(k).

Figure 4D:
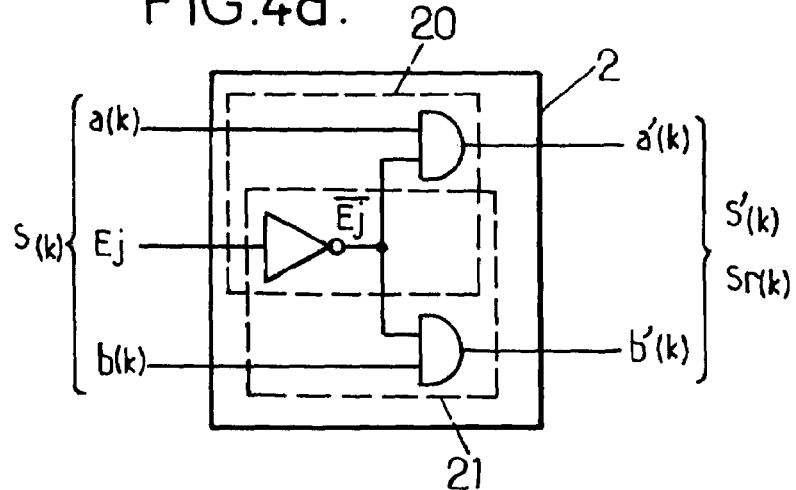

In FIG. 4d, when the logic processing corresponds to a type AND logic function with the complemented envelope logic signal, the first 20 and the second 21 logic cell comprise an AND gate one of the inputs of which receives the envelope logic signal by means of an inverter and the other of the inputs receives the corresponding symbol element a(k), b(k) in order to deliver the validated encoded symbol S'(k) or the pause symbol Sr(k).

In FIG. 4e, when the logic processing corresponds to a type OR logic function between the symbol elements of the encoded symbols a(k), b(k) and envelope logic signal $E_j$ the first 20 and the second 21 logic cell consist of a gate OR receiving, in one of their inputs the envelope logic signal $E_j$ and in the other of their inputs, the symbol element a(k), respectively b(k) in order to deliver the validated encoded symbols S'(k) or pause symbols Sr(k).

Finally, a non-restrictive embodiment of the discrimination module 1 of the encapsulation module $C_j$ will be described in a preferential version, in connection with FIG. 5. According to the aforementioned FIG. 5, the discrimination module 1 of the encapsulation message can include an alignment device 10 enabling the synchronisation word $SY_j$ in the encapsulation message to be detected. The alignment device can, in a standard way, consist of a memory of sufficient size enabling a reading of the field relative to the synchronisation word $SY_j$ and comparison of the read values of this field with a reference message, marked CR. On correspondence of the read values between the two fields, the memorised value in the field of length $L_j$ of the encapsulation message $C_j$ can then be loaded into a reading circuit 11, such as shown in FIG. 5.

Finally, the discrimination module 1 of the encapsulation message can include also an up/down counter 12, which is loaded, from the length value read in the field $L_j$, this up/down counter enabling the envelope signal $E_j$ to be generated one of the logic states of which has a length proportional to the aforementioned length value $L_j$. It is understood that the up/down counter plays, as it were, the role of a mono-stable circuit the metastable state of which is adjusted as a function of the length value loaded into this latter. Of course, the up/down counter is normally driven by a clock signal CK such as mentioned previously in the description.

Finally, it is desirable to point out, after the VITERBI decoding process applied to the aforementioned encoded signals, which are in fact useful data, i.e. the data obtained other than that in relation to the decoding of the pause symbols.

With this object, the envelope logic signal $E_j$ can therefore be shifted and delayed from the processing time necessary to the decoding of one or several data, as shown in FIG. 6, this shifted envelope logic signal $\Delta E_j$ enabling in fact the data obtained by decoding of only the validated encoded symbols to be synchronised and discriminated.

The method for encoding, the method for decoding and the decoding device, the objects of the present invention, can be used in a particularly advantageous way in all applications subjected to a digital/analogue then analogue/digital data conversion and requiring a detection of the errors correction.

They are particularly advantageous and adapted to all applications which require the multiplexing of data to be carried out in the physical layer of the transmission network.

Thus, all communication networks of packets operating transmissions in non connected mode and absolutely requiring the use of an errors correction process can be subjected to an encoding process of a channel the ends of which are composed of a convolutive encoder and a VITERBI type decoder such as described in the description.

What is claimed:

1. A method for convolutive encoding and transmission by packets of a digital serial data series flow which is formed by a successive number of bits of a specified value with a current bit of rank k being designated as i(k), through a convolutive encoding of depth K, said method comprising the steps:
   a) discriminating, in said series flow, a set of successive current bits, in order to form a current packet of digital data;
   b) defining for said convolutive encoding a stable starting binary value;
   c) subjecting said digital data of said current packet to a convolutive encoding process, at each value of the current bit i(k) corresponding to a first encoded value a(k) and a second encoded value b(k), a set of these first and second encoded values constituting an encoded symbol S(k)={a(k); b(k)} representative of the current bit i(k);
   d) forming from the encoded symbols, a packet of encoded symbols, by a concatenation of said encoded symbols;
   e) assigning to said convolutive encoding process said stable starting binary value as a constraint value at the end of said packet of encoded symbols;
   f) generating at least one encapsulation message of said packet of encoded symbols;
   g) transmitting, in a common message, said at least one encapsulation message and said packet of encoded symbols for decoding and use; and
   h) repeating the operations a) to g) for each current packet of digital data constituting said series flow of bits.

2. A method for decoding a digital data series flow encoded by convolutive encoding using a stable starting binary value and transmitted by packets, said method comprising the following steps:
   a) receiving a packet of encoded symbols S(k) and an encapsulation message;
   b) discriminating said encapsulation message in order to generate an envelope logic signal having a first binary value prior to the start, and subsequently at the end, of said packet of encoded symbols and a second binary value during the reception of said packet of encoded symbols;
   c) subjecting said envelope logic signal and said encoded packet of symbols to a logic processing enabling to generate;
      successive pause symbols of specified value and rank, on the basis of said stable starting binary value, for said first binary value of said envelope logic signal, and
      successive validated encoded symbols S' k={a'(k);b'(k)} of rank k corresponding to said packet of encoded symbols S(k) for said secondary binary value of said envelope logic signal; and
   d) subjecting said successive pause symbols and validated encoded symbols of given rank to a continuous VITERBI type decoding, said pause symbols providing continuity of a decoding lattice by imposing a stable state between two packets of said successive validated encoded symbols.

3. A decoding method according to claim 2, wherein for a pause state as well as for a first logic value of said envelope logic signal corresponding to start of a packet and end of a packet equal to the value zero and for a second logic value of said envelope logic signal equal to the value 1, said logic processing comprises applying to each received symbol a(k), b(k) an AND logic function with said envelope logic signal.

4. A decoding method according to claim 2, wherein for a pause state as well as for a first logic value of said envelope logic signal corresponding to start of a packet and end of a packet equal to the value 1 and for a second logic value of said envelope logic signal equal to the value 0, said logic processing comprises applying to each received symbol a(k), b(k) an OR logic function with the complement of said envelope logic signal.

5. A decoding method according to claim 2, wherein for a pause state and a first logic value of said envelope logic signal equal to the value 0 and for a signal representing activity of the envelope corresponding to a second logic value equal to the value 1, said logic processing comprises applying to each symbol a(k), b(k) an AND logic function with the complement of said logic signal.

6. A decoding method according to claim 2, wherein for a pause state and a first logic value of said envelope logic signal equal to the value 1, and for a signal representing the activity of the envelope corresponding to a second logic value equal to 0, said logic processing comprises applying to each symbol a(k), b(k) an OR function with said envelope logic signal.

7. A decoding device for a series flow of digital data encoded by convolutive encoding using a stable starting binary value and transmitted by packets comprising:
   means for receiving a packet of encoded symbols S(k) and an encapsulation message;
   means for discriminating said encapsulation message so as to enable an envelope logic signal to be generated for said packet, said envelope logic signal having a first binary value before the beginning and after the end of the packet of encoded symbols and a second binary value during the reception of the packet of encoded symbols;
   logic processing means for generating:
      successive pause symbols of specified value and rank, on the basis of said stable starting binary value of the received packet, for said first binary value of said envelope logic signal, and
      successive validated encoded symbols S' k={a'(k); b'(k)} of rank k corresponding to said packet of encoded symbols S(k) for said second binary value of said envelope logic signal; and
      VITERBI decoding means for carrying out, on the basis of said successive pause symbols and said validated encoded symbols of given rank, a continuous VITERBI type decoding, said pause symbols providing continuity of a decoding lattice by imposing a stable state between two packets of said successive validated encoded symbols.

8. A device according to claim 7, wherein said logic processing means include at least:
   a first logic cell receiving, in a first input, each first symbol element a(k), and, in a second input, said envelope logic signal and delivering a first validated symbol element a'(k);
   a second logic cell receiving, in a first input, each second symbol element b(k), and, in a second input, said envelope logic signal and delivering a second validated symbol element b'(k).

9. A device according to claim 8, wherein said first and second logic cells are constituted by an identical logic gate, each provided with a first input and a second input, the first input of each logic gate constituting the first input of each logic cell and the second in put of each logic gate being connected to the second input of each logic cell directly or by means of a logic inverter, as a function of the logic value assigned to the first and second binary value of said envelope logic signal respectively.

10. A method for convolutive encoding and transmission by packets of a digital data series flow which is formed by successive number of bits of a specified value with a current bit of rank k being designated as i(k), through a convolutive encoding of depth K, said method comprising the following steps:
   a) discriminating, in said series flow, a set of successive current bits, in order to form a current packet of digital data;
   b) defining for said convolutive encoding a stable starting binary value;
   c) subjecting said digital data of said current packet to a convolutive encoding process, at each value of the current bit i(k) corresponding to a first encoded value a(k) and a second encoded value b(k), a set of the first and second encoded values constituting an encoded symbol S(k)=a{(k); b(k)}representative of the current bit i(k) and a plurality of encoded symbols being generated;
   d) forming, from the encoded symbols, a packet of encoded symbols, by a concatenation of said encoded symbols;
   e) assigning to said convolutive encoding process said stable starting binary value as a constraint value at the end of said packet of encoded symbols;
   f) generating at least one encapsulation message of said packet of encoded symbols, said message comprising a packet length field;
   g) transmitting, in a common message, said at least one encapsulation message and said packet of encoded symbols for decoding and use; and
   h) repeating the operations a) to g) for each current packet of digital data constituting said series flow of bits.

11. A method for decoding a digital data series flow encoded by convolutive decoding using a stable starting binary value and transmitted by packets, comprising the following steps:
   a) receiving a packet of encoded symbols S(k) and an encapsulation message comprising a field Indicating the length of said packet of encoded symbols;
   b) discriminating said encapsulation message in order to generate, on the basis of the packet length, an envelope logic signal having a first binary value prior to the start and subsequently at the end of said packet of encoded symbols and a second binary value during the reception of said packet of encoded symbols;
   c) subjecting said envelope logic signal and said packet of encoded symbols to a logic processing enabling to generate:
      successive pause symbols of specified value and rank, on the basis of said stable starting binary value, for said first binary value of said envelope logic signal, and successive validated encoded symbols S'k={a'(k); b'(k)} of rank k corresponding to said packets of encoded symbols S(k) for said second binary value of said envelope logic signal; and d) subjecting said successive pause symbols and validated encoded symbols of given rank to a continuous VITERBI type decoding, said pause symbols providing continuity of a decoding lattice by imposing a stable state between two packets of said successive validated encoded symbols.

12. A decoding method according to claim 11, wherein for a pause state as well as for a first logic value of said envelope logic signal corresponding to start of a packet and end of a packet equal to the value of zero and for a second logic value of said envelope logic signal equal to the value 1, said logic processing comprises applying to each received symbol a(k), b(k) an AND logic function with said envelope logic signal.

13. A decoding method according to claim 11, wherein for a pause state as well as for a first logic value of said envelope logic signal corresponding to start of a packet and end of a packet equal to the value 1 and for a second logic value of said envelope logic signal equal to the value 0, said logic processing comprises applying to each received symbol a(k), b(k) an OR logic function with the complement of said envelope logic signal.

14. A decoding method according to claim 11, wherein for a pause state and a first logic value of said envelope logic signal equal to the value of 0, and for a signal representing activity of the envelope corresponding to a second logic value equal to the value 1, said logic processing comprises applying to each symbol a(k), b(k) an AND logic function with the complement of said envelope logic signal.

15. A decoding method according to claim 11, wherein for a pause state and a first logic value of said envelope logic signal equal to the value 1, and for a signal representing activity of the envelope corresponding to a second logic value equal to 0, said logic processing comprises applying to each symbol a(k), b(k) an OR logic function with said envelope logic signal.

16. A decoding device for a series flow of digital data encoded by convolutive encoding using a stable starting binary value and transmitted by packets, said device comprising:

means for receiving a packet of encoded symbols S(k) and an encapsulation message comprising a field indicating the length of the packet of encoded symbols;

means for discriminating said encapsulation message for enabling an envelope logic signal to be generated for said packet, on the basis of the packet length, said envelope logic signal having a first binary value prior to the start and subsequently at the end of the packet of encoded symbols and a second binary value during receiving of the packet;

logic processing means for generating:

successive pause symbols of specified value and rank, on the basis of said stable starting binary value, for said first binary value of said envelope logic signal, and successive validated encoded symbols S'k={a'(k); b'(k)} of rank k corresponding to said packet of encoded symbols S(k) for said second binary value of said envelope logic signal; and VITERBI decoding means for carrying out, on the basis of said successive pause symbols and validated encoded symbols of given rank, a continuous VITERBI type decoding, said pause symbols providing continuity of a decoding lattice by imposing a stable state between two packets of said successive validated encoded symbols.

17. A device according to claim 16, wherein said logic processing means include at least:

a first logic cell receiving, in a first input, each first symbol element a(k), and, in a second input, said envelope logic signal, and delivering a first validated symbol element a'(k); and a second logic cell receiving, in a first input, each second symbol element b(k), and, in a second input, said envelope logic signal, and delivering a second validated symbol element b'(k).

18. A device according to claim 17, wherein each of said first logic cell and said second logic cell comprises an identical logic gate, each gate having a first input and a second input, the first input of each logic gate constituting the first input of each logic cell and the second input of each logic gate being connected to the second input of each logic cell directly or by means of a logic inverter, as a function of the logic value assigned to the first and second binary value of said envelope logic signal, respectively.

* * * * *